Jan. 3, 1956 J. S. LE GRAND 2,729,743
LOGARITHMIC AMPLIFIER DETECTOR
Filed Sept. 2, 1954 2 Sheets-Sheet 1
Fig. 1
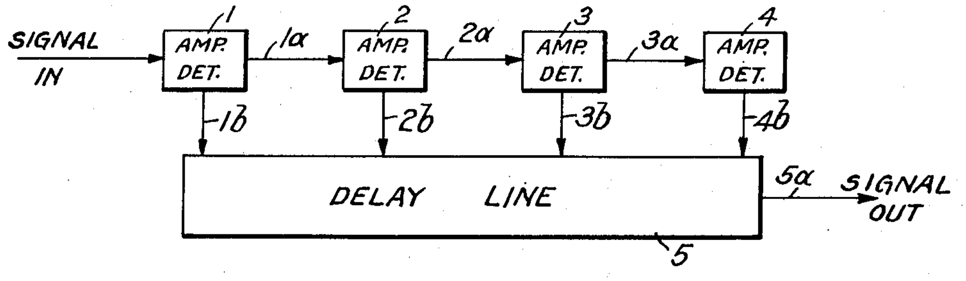
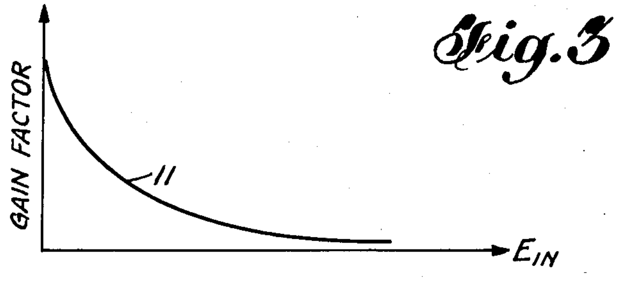
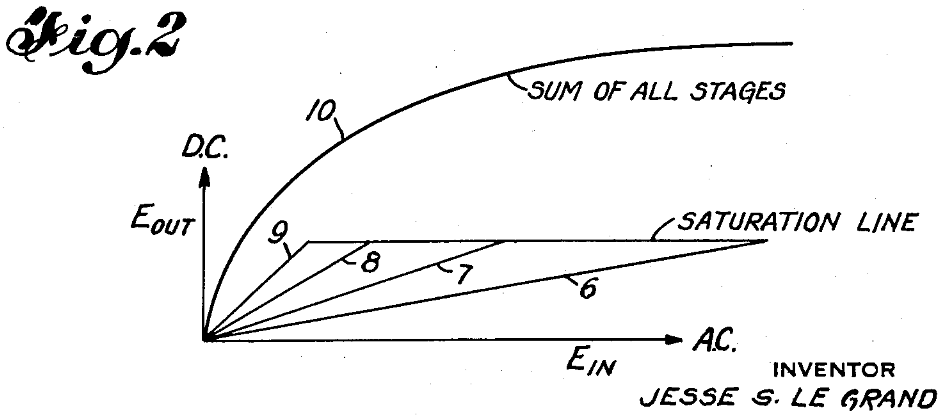
INVENTOR
JESSE S. LE GRAND
BY Ernest Fanwick
ATTORNEY Jan. 3, 1956 J. S. LE GRAND 2,729,743
LOGARITHMIC AMPLIFIER DETECTOR
Filed Sept. 2, 1954 2 Sheets-Sheet 2

INVENTOR
JESSE S. LE GRAND
BY Ernest Fanwick
ATTORNEY

1

2,729,743

LOGARITHMIC AMPLIFIER DETECTOR

Jesse S. Le Grand, Wood-Ridge, N. J., assignor to International Telephone and Telegraph Corporation, Nutley, N. J., a corporation of Maryland Application September 2, 1954, Serial No. 453,773
11 Claims. (Cl. 250—27)

This invention relates to signal amplifiers and more particularly to amplifiers which include a plurality of cascaded stages to produce a direct current output signal which is logarithmically related to an alternating current signal.

In many applications in the electronic art and in other related fields it is desirable to have an amplifier whose gain is a logarithmic function. Such logarithmic amplifiers are extremely useful where the input signal voltage to the amplifier varies over a wide amplitude range.

Amplifiers having gains responsive to a logarithmic function are well-known in the art. Such known circuits, however, do not generally possess characteristics that make them adaptable for use when the input signal has a "fast modulation" rate since their response time is appreciable when compared to the modulation and thus this appreciable response time causes inaccuracies in the desired logarithmic relationship of the input to the output signal. Moreover such prior art amplifiers have not been able to accommodate a signal in which the amplitude modulated bandwidth is comparable to the bandwidth of the amplifier. In addition, the prior art logarithmic amplifier detectors have utilized a diode as a detector and thus require at least two electronic tubes, a detector and an amplifier, for each of the cascaded stages.

One of the objects of this invention, therefore, is to provide a new and useful logarithmic amplifier detector which utilizes a minimum number of electronic tubes.

Another object of this invention is to provide a logarithmic amplifier detector capable of handling a signal having a modulation bandwidth comparable to the bandwidth of the amplifier.

A further object of my invention is to provide for the use with a logarithmic amplifier having a plurality of cascaded stages, means to insure that the contribution to the output signal from each of the stages is in time coincidence.

One of the features of this invention is the provision of a plurality of cascaded amplifier stages each having an output coupled to a delay line having a plurality of sections, the time delay of each section being equal to the time delay of the signal passing through one of the amplifier stages and thus the direct current (D. C.) contribution from each amplifier stage taken across the delay line termination is in time coincidence enabling the logarithmic amplifier of this invention to accommodate an alternating current (A. C.) signal having a fast modulation rate and a modulation bandwidth which is comparable to the bandwidth of the amplifier circuit itself.

Another feature of this invention is the use in each of the cascaded stages of an electron tube having at least a cathode, an anode and a plurality of control electrodes wherein one of the control electrodes and the cathode function as a diode detector and wherein a grid-leak resistance circuit is coupled to the input control electrode.

The above-mentioned and other features and objects

2 of this invention will become more apparent by reference to the following description taken in conjunction with the accompanying drawings, in which:

Fig. 1 is a schematic diagram in block form of one embodiment of the logarithmic amplifier of this invention;

Figs. 2 and 3 are graphical illustrations helpful in the explanation of my invention.

Figure 4:
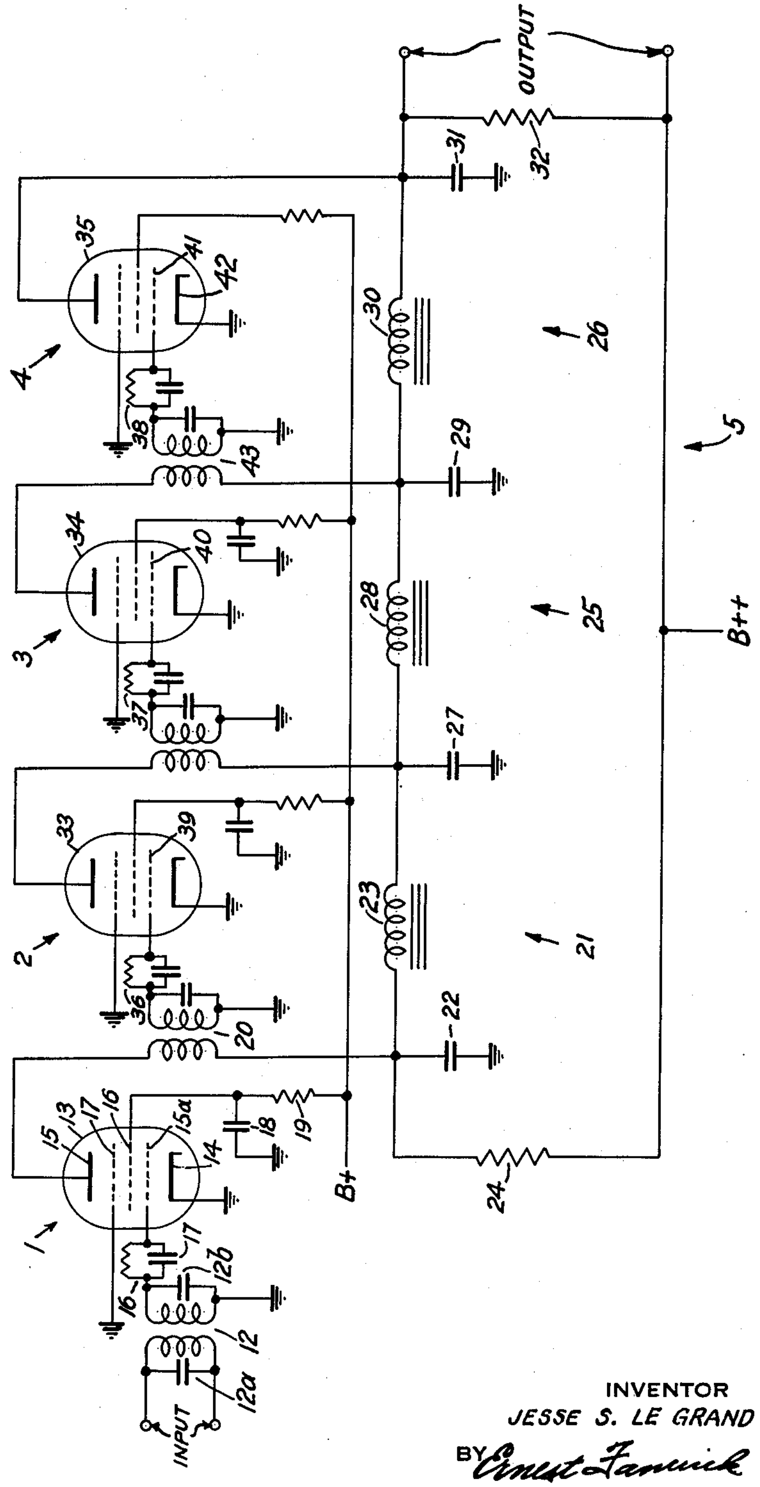
Fig. 4 is a schematic circuit diagram of one embodiment of the logarithmic amplifier in accordance with this invention.

Referring to Fig. 1 of the drawing, a schematic diagram in block form of one embodiment of a logarithmic amplifier in accordance with the principles of my invention is shown wherein a plurality of amplifier stages 1, 2, 3 and 4 are connected in series combination. In the circuit illustrated in Fig. 1 an A. C. input signal is connected to the input terminal of amplifier stage 1. An A. C. signal responsive to the output of amplifier stage 1 is applied over line 1*a* to the input of amplifier 2, an A. C. signal responsive to the output of amplifier 2 is applied over line 2*a* to the input of amplifier 3 and so forth throughout the series. The output plate currents of amplifiers 1, 2, 3 and 4 are individually coupled over lines 1*b*, 2*b*, 3*b* and 4*b* to a delay line network 5. The output D. C. signal, logarithmically related to the input A. C. signal, as hereinafter described, is coupled from the termination of delay line 5 over line 5*a*.

Referring now to Figs. 2 and 3 of the drawing, curves 6, 7, 8 and 9 represent amplitude of the output signals from amplifier stages 1, 2, 3 and 4 respectively as functions of the amplitude of the input signal applied to the input terminal of amplifier 1. These curves are plotted with the amplitude of the alternating voltage output as the ordinate against the amplitude of the input signal to amplifier 1 as the abscissa. Each of the amplifiers 1, 2, 3 and 4 is designed to provide an output that is a linear function of the signal to the amplifier stage until the input signal is of sufficient amplitude to saturate the particular stage. When the input signal reaches an amplitude sufficient to saturate a given amplifier, to which it is applied, the amplitude of the output of that amplifier will remain substantially constant. It can be seen from Fig. 2 that curve 9 representing the amplitude of the output signal of the amplifier 4 rises in a linear fashion to saturation level first since the input signal has been amplified by the preceding three amplifier stages by the time it reaches the output circuit of amplifier 4.

The slope of curve 8 is less steep than that of curve 9 since the signal from the output circuit of amplifier 3 has been amplified by only three of the cascaded amplifiers. In a similar fashion the slopes of curves 7 and 6 corresponding to the output signal of the preceding amplifiers 2 and 1 respectively are seen to be less steep than the slopes of the preceding curves 8 and 9. Curve 10 represents the sum of the several output signals and although not exactly a perfectly smooth curve, it does approximate an exponential or logarithmic curve for the sum of the output of all the individual stages.

Referring now to Fig. 3 of the drawing, there is shown a logarithmic curve computed by plotting the input signal voltage to the amplifier 1 as the abscissa and the gain factor of the output of the cascaded amplifier of this invention illustrated in Fig. 1 as the ordinate. It can be seen that curve 11 of Fig. 2 closely approximates an exponential function and it is of course possible by proper design of the individual amplifier stages 1–4 to maintain curve 11 within extreme tolerances to a true exponential curve over a large range of input signals.

Referring again to the simplified block diagram shown in Fig. 1 of the drawings, it is seen that the total signal output represented by curve 10 of Fig. 2 is coupled from line 5*a* whereas the detected or rectified outputs of each of the individual stages are coupled over lines 1*b*, 2*b*, 3*b*, 4*b* to the delay line 5. The delay line 5 functions so that the detected output of the early amplifier stages are delayed by an amount equal to the delay encountered as the signal progresses through the later amplifier stages.

Referring now to Fig. 4 of the drawing, there is shown a schematic circuit diagram of an embodiment of a logarithmic cascaded amplifier in accordance with the principles of my invention. An A. C. signal input is coupled to the input terminals and inductively coupled through transformer 12 to electron tube 13 forming part of amplifier stage 1. It is noted that the input and output windings of the coupler transformer 12, as well as all other coupling transformers may be tuned or untuned through the use of capacitors 12*a* and 12*b* across the primary and secondary windings. Obviously, if desired only one of the two windings need be tuned. The electron discharge device 13 comprises a pentode having a cathode 14, anode 15 and control, screen and suppressor grids 15*a*, 16 and 17, respectively. The input alternating current signal coupled through transformer 12 is applied to the control grid 15*a* through the grid-leak resistor 16 and bypass capacitor 17. Of course, the grid resistor 16 and grid condenser 17 have a time constant which is sufficiently low enough to allow for the following of a modulation frequency considerably in excess of the highest modulation frequency to be encountered in an input signal. A capacitor 18 and resistor 19 form a screen grid time constant circuit which should have a time constant no larger than is necessary for the proper decoupling. A positive voltage source is coupled to the screen grid 16 through resistor 19 and this voltage source should have reasonably good regulation. The suppressor grid 17 is coupled directly to ground. The amplified output of the first amplifier stage is coupled from the anode 15 to the primary winding of transformer 20. The tuned coupling circuit between stages functions to substantially restore the wave forms to an essentially sinusoidal form. The detected output of the first stage is coupled to the first section 21 of delay line 5. The first section 21 of delay line 5 comprises capacitor 22 and inductance 23. Resistance 24 provides one end termination for the delay line 5. The A. C. output of amplifier stage 1 is coupled to amplifier stage 2 which is identical in all respects to the amplifier stage 1 and thence to amplifier stages 3 and 4, also identical to the amplifier stage 1. The rectified or detected output of each amplifier stage 2 and 3 is coupled to delay line sections 25 and 26 comprising capacitor 27, inductor 28 and capacitor 29 and inductor 30 and capacitor 31, respectively. The capacitors 31 and 22 are one-half the value of the capacitors 27 and 29, as will be readily recognized by those skilled in the art, in order to have all the components form an artificial transmission line. Resistance 32 provides the artificial transmission line termination across which the output signal is obtained. The delay of each delay line section 21, 25 and 26 is equal in amount to the delay that the signal encounters as it progresses through each of the amplifier stages and thus the contribution from each amplifier stage across the terminal resistance 32 is in time coincidence. A secondary function of the delay line components is to provide decoupling at the input signal frequency.

An amplifier in accordance with the principles of this invention has a selectivity which is a function of signal strength since a weak signal passes through all stages while a strong signal passes only the first stage. If the bandwith of the input signal is substantially equal to the bandwidth of the coupling network it may be advantageous to use two sections of delay line for each amplifier stage and an "*m*" derived terminating section at each end of the delay line 5.

The operation of this invention is best explained by considering the effects on the various amplifier stages as an input signal is raised from zero to a high value. Althrough four stages are shown, it is obvious that any number desired is feasible and I have found that approximately a 20 db range per stage can be obtained from the amplifier of my invention.

With no signal input all the tubes 13, 33, 34 and 35 draw maximum plate current since the only bias that is provided is by the contact potential drop across the grid-leak resistors 16, 36, 37 and 38, that is the plates draw more current than with a signal output. As the input signal is increased, control grid 41 and the cathode 42 will function as a diode detector of the input alternating current signal, and the bias on the control grid 41 of tube 35 in stage 4 will increase. The plate current of tube 35 will decrease with increasing value of signal input and thus will become a series of partial sine wave pulses having a decreasing average value as the signal input to control grid 41 increases.

If the input signal continues to increase, the average plate current of tube 35 continues to decrease until tube 34 in stage 3 delivers its maximum possible signal. At the same time the plate current of tube 34 also decreases due to the increased bias caused by its own grid circuit rectification. As the signal input to tube 34 continues to increase its average plate current continues to decrease but the signal delivered to tube 35 through transformer 43 remains essentially constant. It will be recognized that tube 34 has a circuit configuration similar to that found in the limiter stage of a frequency modulation receiver. Additional signal results in the plate current of tube 33 decreasing and then the plate current of tube 13 decreasing to a minimum value. Thus, it is seen that the total plate current output with no signal input is maximum and decreases very nearly in proportion to the logarithm of the input signal.

While I have described above the principles of my invention in connection with specific apparatus, it is to be clearly understood that this description is made only by way of example and not as a limitation to the scope of my invention as set forth in the objects thereof and in the accompanying claims.

I claim:

1. A logarithmic amplifier detector comprising a plurality of voltage amplifiers each adapted to receive a single input signal and to provide an output having an amplitude that is a linear function of the amplitude of the input signal to that amplifier for all values of input signals below a predetermined amplitude and having a substantially constant amplitude for all values of signals above said predetermined amplitude, means connecting said amplifiers in series combination whereby an alternating signal responsive to the output of each amplifier is applied as the input signal to the next succeeding amplifier in said series, means for applying the signal to be amplified as the input signal to first amplifier in said series, means to rectify the signal in each of said amplifiers, time delay means for the rectified signal output of each of said amplifiers, said time delay being equal to the time for said alternating signal to proceed through all of the succeeding amplifiers and means to combine the time delayed rectified output of all of said amplifiers whereby the output of said combining means is proportional in amplitude to the logarithm of said input signal to be amplified.

2. A logarithmic amplifier circuit comprising a plurality of saturable amplifiers each having a cathode, an anode and at least one control electrode, said amplifiers being connected in series combination, means for applying an alternating signal to be amplified as the input signal to the first control electrode of the first of said amplifiers in said series combination, means for obtaining a direct current output signal from the anode circuits of said amplifiers in said series combination and time delay means for the output signals from each of said amplifiers to delay said direct current signals an amount of time equal to the time of transmission for each of said alternating signals through the succeeding amplifiers in said series combination and means for producing a direct current signal from the summation of said time delayed output signals whereby the amplitude of said combined signal is proportional in amplitude to the logarithm of the amplitude of said alternating signal input.

3. An amplifier according to claim 2 wherein the control electrode in each of said amplifiers in series combination includes at least means for producing a grid-leak bias.

4. A logarithmic amplifier circuit comprising a plurality of saturable amplifier stages each having an electron discharge device including a cathode, an anode and at least a first control electrode, said amplifier stages being connected in series combination, means for applying an alternating current signal to be amplified as the input signal to the first control electrode of the first of said amplifier stages, said first control electrode and said cathode functioning as a diode detector, means for obtaining a rectified output signal from the anode circuit of said amplifiers in said series combination and time delay means for the rectified output signal from each of said amplifiers to delay said signals an amount of time equal to the time of transmission for each of said signals through the succeeding amplifiers in said series combination, the alternating output of each of said anodes being coupled to the first control electrode of the next succeeding amplifier stage, said control electrode having associated therewith a grid-leak resistance circuit and means for producing a signal from the summation of said time delay output signals whereby the amplitude of said combined signal is proportional in amplitude to the logarithm rate of the amplitude of said signal to be amplified.

5. An amplifier according to claim 4 wherein each of said electron discharge devices further includes a second control electrode and a third control electrode, means to couple said third control electrode to said cathode and means to bias said second control electrode positively with respect to said cathode.

6. An amplifier according to claim 4 which further includes a capacitor and means to shunt said grid-leak resistance with said capacitor.

7. An amplifier according to claim 4 wherein said means to couple the anode of each stage to the first control electrode of the succeeding stage includes a coupling transformer having its primary winding coupled between said anode and said time delay means and its secondary winding coupled to said grid-leak resistance circuit.

8. An amplifier according to claim 4 wherein said time delay means includes an artificial transmission line having a plurality of sections and terminated at each end by a resistance, each of said sections having a delay time equal to the delay time of the corresponding amplifier stage.

9. A logarithmic amplifier circuit comprising a plurality of saturable amplifier stages each having an electron discharge device including a cathode, an anode, a first control electrode, a second control electrode and a third control electrode, means to couple said third control electrode to said cathode and means to bias said second electrode positively with respect to said cathode, said amplifier stages being connected in series combination, means for applying an alternating current signal to be amplified as the input signal to the first control electrode of the first of said amplifier stages, said first control electrode and said cathode functioning as a diode detector, means for obtaining a rectified output signal from the anode circuit of said amplifiers in said series combination and time delay means for the output signal from each of said amplifiers to delay said signals an amount of time equal to the time of transmission of signals through the succeeding amplifiers in said series combination, said time delay means including an artificial transmission line having a plurality of sections and terminated at each end by a resistance, each of said sections having a delay time equal to the delay time of the corresponding amplifier stage, the alternating output of each of said anodes being coupled to the first control electrode of the next succeeding amplifier stage, said first control electrode having associated therewith a grid-leak resistance circuit including a capacitor and means to shunt said grid-leak resistance with said capacitor.

10. A logarithmic amplifier circuit comprising a plurality of saturable amplifier stages each having an electron discharge device including a cathode, an anode and at least a first control electrode, said amplifier stages being connected in series combination, means for applying an alternating current signal to be amplified as the input signal to the first control electrode of the first of said amplifier stages, said first control electrode and said cathode functioning as a diode detector, means for obtaining a direct current output signal from the anode circuit of said amplifiers in said series combination and time delay means for the output signal from each of said amplifiers to delay said signals an amount of time equal to the time of transmission for each of said signals through the succeeding amplifiers in said series combination, the alternating output of each of said anodes being coupled to the first control electrode of the next succeeding amplifier stage and means for producing a signal from the summation of said time delay output signals whereby the amplitude of said combined signal is proportional in amplitude to the logarithm rate of the amplitude of said signal to be amplified.

11. A logarithmic amplifier circuit comprising a plurality of saturable amplifier stages each having an electron discharge device including a cathode, an anode, a first control electrode, a second control electrode and a third control electrode, means to couple said third control electrode to said cathode and means to bias said second electrode positively with respect to said cathode, said amplifier stages being connected in series combination, means for applying an alternating current signal to be amplified as the input signal to the first control electrode of the first of said amplifier stages, said first control electrode and said cathode functioning as a diode detector, means for obtaining a rectified output signal from the anode circuit of said amplifiers in said series combination and time delay means for the rectified output signal from each of said amplifiers to delay said signals an amount of time equal to the time of transmission of signals through the succeeding amplifiers in said series combination, said time delay means including an artificial transmission line having a plurality of sections and terminated at each end by a resistance, each of said sections having a delay time equal to the delay time of the corresponding amplifier stage, the alternating output of each of said anodes being coupled to the first control electrode of the next succeeding amplifier stage, and means for producing a signal from the summation of said time delay output signals whereby the amplitude of said combined signal is proportional in amplitude to the logarithm rate of the amplitude of said signal to be amplified.

References Cited in the file of this patent

UNITED STATES PATENTS 2,263,376 Blumlein et al. ---------- Nov. 18, 1941
2,289,840 Herz ------------------ July 14, 1942